United States Patent
Fukuhara

(10) Patent No.: US 11,848,325 B2
(45) Date of Patent: Dec. 19, 2023

(54) LOAD DRIVE DEVICE

(71) Applicant: DENSO CORPORATION, Kariya (JP)

(72) Inventor: Jun Fukuhara, Kariya (JP)

(73) Assignee: DENSO CORPORATION, Kariya (JP)

( * ) Notice: Subject to any disclaimer, the term of this patent is extended or adjusted under 35 U.S.C. 154(b) by 91 days.

(21) Appl. No.: 17/524,071

(22) Filed: Nov. 11, 2021

(65) Prior Publication Data

US 2022/0068918 A1    Mar. 3, 2022

Related U.S. Application Data

(63) Continuation of application No. PCT/JP2020/014006, filed on Mar. 27, 2020.

(30) Foreign Application Priority Data

May 27, 2019   (JP) .................................. 2019-098592

(51) Int. Cl.
| | | |
|---|---|---|
| *H01L 27/088* | (2006.01) | |
| *H03K 17/082* | (2006.01) | |
| *H01L 25/065* | (2023.01) | |
| *H01L 25/18* | (2023.01) | |

(52) U.S. Cl.
CPC ....... *H01L 27/088* (2013.01); *H03K 17/0822* (2013.01); *H01L 25/0655* (2013.01); *H01L 25/18* (2013.01)

(58) Field of Classification Search
CPC ... H01L 27/088; H01L 25/0655; H01L 25/18; H01L 29/7803; H01L 29/7813; H01L 29/7815; H01L 21/76; H01L 29/78; H03K 17/0822; H03K 2217/0027; H03K 2217/0081
See application file for complete search history.

(56) References Cited

U.S. PATENT DOCUMENTS

| | | | | |
|---|---|---|---|---|
| 2013/0001639 | A1* | 1/2013 | Iwasaki | ................... H01L 29/32 257/140 |
| 2014/0084361 | A1* | 3/2014 | Saito | ................. H01L 29/66712 257/329 |
| 2015/0263144 | A1* | 9/2015 | Misu | ................... H01L 29/7397 257/139 |
| 2019/0341483 | A1* | 11/2019 | Harada | .................. G01R 19/10 |

FOREIGN PATENT DOCUMENTS

| | | |
|---|---|---|
| JP | 2008-78375 A | 4/2008 |
| JP | 2012-084625 A | 4/2012 |

* cited by examiner

*Primary Examiner* — Metasebia T Retebo

(74) *Attorney, Agent, or Firm* — POSZ LAW GROUP, PLC

(57) ABSTRACT

A load drive device includes a semiconductor element and a current detection resistor. The semiconductor element includes a first main electrode provided on a front surface side and having a higher potential and a second main electrode provided on a back surface side opposite to the front surface and having a lower potential than the first main electrode. The second main electrode is divided such that the semiconductor element includes a main element that supplies electric power to a load in response to the main element being turned on and a sense element that detects a current. The current detection resistor is connected in series to the sense element and provided between the second main electrode of the sense element and the second main electrode of the main element.

5 Claims, 10 Drawing Sheets

| | Vgs | MAIN ELEMENT | | SENSE ELEMENT | | VIRTUAL SENSE RATIO | VIRTUAL SENSE RATIO (BASED ON Vgs10V) |
|---|---|---|---|---|---|---|---|
| | | Rdm | Rcm | Rds | Rcs | | |
| SATURATION REGION | 3 | 1.0 | 1000.0 | 0.5 | 1000.0 | 1.00 | 23.0% |
| | 4 | 1.0 | 500.0 | 0.5 | 500.0 | 1.00 | 23.0% |
| | 5 | 1.0 | 16.7 | 0.5 | 16.7 | 0.97 | 19.6% |
| LINEAR REGION | 7.5 | 1.0 | 2.5 | 0.5 | 2.5 | 0.86 | 5.5% |
| FULL-ON REGION | 10 | 1.0 | 1.7 | 0.5 | 1.7 | 0.81 | 0.0% |

|  | Vgs | MAIN MOS | | SENSE MOS | | Rs | SENSE RATIO | SENSE RATIO (BASED ON Vgs10V) |
|---|---|---|---|---|---|---|---|---|
|  |  | Rdm | Rcm | Rds | Rcs |  |  |  |
| SATURATION REGION | 3 | 1.0 | 1000.0 | 0.5 | 1000.0 | 0.5 | 1.00 | 0.0% |
|  | 4 | 1.0 | 500.0 | 0.5 | 500.0 | 0.5 | 1.00 | 0.0% |
|  | 5 | 1.0 | 16.7 | 0.5 | 16.7 | 0.5 | 1.00 | 0.0% |
| LINEAR REGION | 7.5 | 1.0 | 2.5 | 0.5 | 2.5 | 0.5 | 1.00 | 0.0% |
| FULL-ON REGION | 10 | 1.0 | 1.7 | 0.5 | 1.7 | 0.5 | 1.00 | 0.0% |

LOAD DRIVE DEVICE

CROSS REFERENCE TO RELATED APPLICATIONS

The present application is a continuation application of International Patent Application No. PCT/JP2020/014006 filed on Mar. 27, 2020, which designated the U.S. and claims the benefit of priority from Japanese Patent Application No. 2019-098592 filed on May 27, 2019. The entire disclosures of all of the above applications are incorporated herein by reference.

TECHNICAL FIELD

The present disclosure relates to a load drive device.

BACKGROUND

A load drive device that includes a semiconductor element and a current detection resistor has been proposed. The semiconductor element has a first main electrode of a high potential side provided on a front surface of the semiconductor substrate and a second main electrode of a low potential side provided on a back surface of the semiconductor substrate. The semiconductor element is divided, by separation of the second main electrode, into a main element that supplies electric power to a load by turning the main element on and a sense element for current detection. The current detection resistor is connected in series to the sense element. Based on the voltage across the current detection resistor, a current flowing through the sense element and thus a current flowing through the main element can be detected.

SUMMARY

The present disclosure provides a load drive device. The load drive device includes a semiconductor element and a current detection resistor. The semiconductor element includes a first main electrode provided on a front surface side and having a higher potential and a second main electrode provided on a back surface side opposite to the front surface and having a lower potential than the first main electrode. The second main electrode is divided such that the semiconductor element includes a main element that supplies electric power to a load in response to the main element being turned on and a sense element that detects a current. The current detection resistor is connected in series to the sense element and provided between the second main electrode of the sense element and the second main electrode of the main element.

BRIEF DESCRIPTION OF DRAWINGS

The features and advantages of the present disclosure will become more apparent from the following detailed description made with reference to the accompanying drawings. In the drawings.

DETAILED DESCRIPTION

Figure 1:
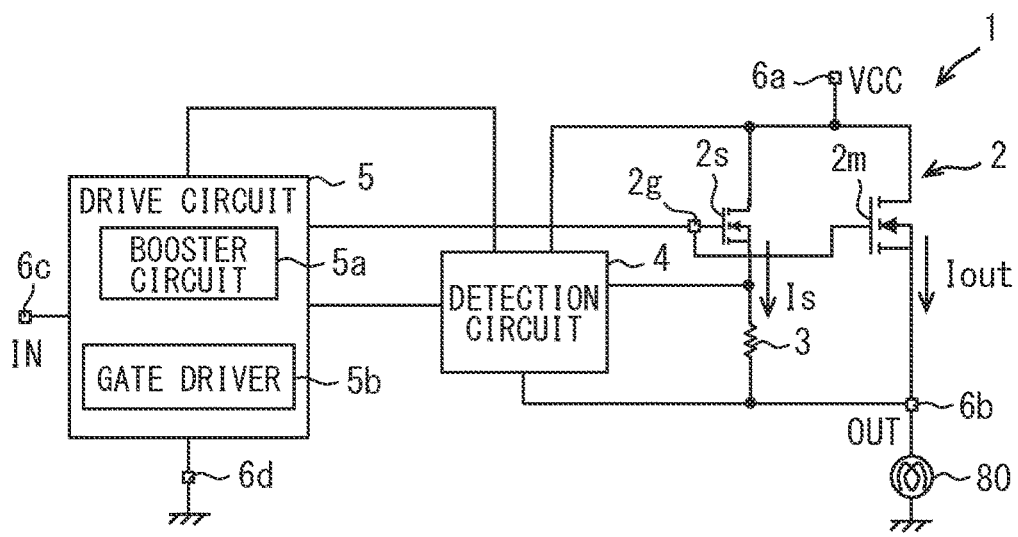
FIG. 1 is a diagram showing a circuit configuration of a load drive device according to a first embodiment.

For example, in a load drive device that includes a semiconductor element and a current detection resistor, the current detection resistor is provided between second main electrodes. When a gate voltage becomes high, influence of the current detection resistor in a current path of the sense element becomes large, and the current flowing through the sense element becomes relatively small. Therefore, a sense ratio between the current flowing through the sense element and the current flowing through the main element fluctuates. The sense ratio in a detection method in which the current detection resistor is provided between the second main electrodes has a gate voltage dependence.

The present disclosure provides a load drive device capable of suppressing a gate voltage dependence of a sense ratio.

The present disclosure further provides a load drive device capable of suppressing a gate voltage dependence of a sense ratio while suppressing an increase in body size.

An exemplary embodiment of the present disclosure provides a load drive device. The load drive device includes a semiconductor element and a current detection resistor. The semiconductor element includes a first main electrode provided on a front surface side and having a higher potential and a second main electrode provided on a back surface side opposite to the front surface and having a lower potential than the first main electrode. The second main electrode is divided such that the semiconductor element includes a main element that supplies electric power to a load in response to the main element being turned on and a sense element that detects a current. The current detection resistor is connected in series to the sense element and provided between the second main electrode of the sense element and the second main electrode of the main element. An interval in the second main electrode between the main element and the sense element is wider than a minimum interval of a wiring provided on the back surface side including the second main electrode. A value of a drift resistance in the main element based on an area of the sense element is defined as Rdm, a value of a drift resistance in the sense element is defined as Rds, and a sense ratio between the sense element and the main element is defined as K. A resistance value of the current detection resistor defined as Rs satisfies $0 \le |Rdm \times K - (Rds + Rs)| < Rdm \times K - Rds$.

In the exemplary embodiment of the present disclosure, the interval between the second main electrode of the main element and the second main electrode of the sense element is wider than the minimum interval of the wiring. In this configuration, the value of the drift resistance Rds of the sense element can be made lower than the value of the drift resistance Rdm of the main element, and thus (Rdm×K−Rds) can be increased. As a result, the virtual sense ratio excluding the current detection resistor has a gate voltage dependence in which the sense ratio decreases as the gate voltage increases. The influence of the current detection resistor can be canceled, and the gate voltage dependence of the sense ratio can be suppressed. In particular, by widening the interval between the second main electrodes, (Rdm×K−Rds) becomes larger. Thus, the value of the current detection resistance can be set high within the range satisfying the above equation. Therefore, it is possible to suppress the gate voltage dependence of the sense ratio while suppressing the increase in the body size.

Another exemplary embodiment of the present disclosure provides a load drive device. The load drive device includes a semiconductor element, a current detection resistor, and a feedback circuit. The semiconductor element includes a first main electrode provided on a front surface side and having a higher potential and a second main electrode provided on a back surface side opposite to the front surface and having a lower potential than the first main electrode. The second main electrode is divided such that the semiconductor element includes a main element that supplies electric power to a load in response to the main element being turned on, a first sense element that detects a current, and a second sense element that detects a current. The current detection resistor is connected in series to the first sense element and provided between the second main electrode of the first sense element and the second main electrode of the main element. The feedback circuit includes an operational amplifier and aligns a potential of the second main electrode between the main element and the second sense element. An interval in the second main electrode between the main element and the first sense element is wider than an interval in the second main electrode between the main element and the second sense element. A value of a drift resistance in the main element based on an area of the first sense element is defined as Rdm, a value of a drift resistance in the first sense element is defined as Rds, and a sense ratio between the first sense element and the main element is defined as K. A resistance value of the current detection resistor defined as Rs satisfies 0≤|Rdm×K−(Rds+Rs)|<Rdm×K−Rds.

In another exemplary embodiment of the present disclosure, the interval between the second main electrode of the main element and the first sense element is wider than the interval between the main element and the second main electrode. In this configuration, the value of the drift resistance Rds of the sense element can be made lower than the value of the drift resistance Rdm of the main element, and thus (Rdm×K−Rds) can be increased. As a result, the virtual sense ratio excluding the current detection resistor has a gate voltage dependence in which the sense ratio decreases as the gate voltage increases. The influence of the current detection resistor can be canceled, and the gate voltage dependence of the sense ratio can be suppressed. In particular, by widening the interval between the second main electrodes on the first sense element side, (Rdm×K−Rds) becomes larger. Thus, the value of the current detection resistance can be set high within the range satisfying the above equation. Therefore, it is possible to suppress the gate voltage dependence of the sense ratio while suppressing the increase in the body size.

Multiple embodiments will be described with reference to the drawings. In the multiple embodiments, functionally and/or structurally corresponding portions are designated with the same reference numerals.

First Embodiment

First, a circuit configuration of a load drive device will be described with reference to FIG. 1.

(Circuit Configuration of Load Drive Device)

The load drive device 1 shown in FIG. 1 is a circuit that drives a load 80. The load drive device 1 includes a semiconductor element 2, a current detection resistor 3, a detection circuit 4, and a drive circuit 5. The load drive device 1 includes a power supply terminal 6a, an output terminal 6b, an input terminal 6c, and a ground terminal 6d as terminals for external connection.

The semiconductor element 2 is a switching element of gate drive. The semiconductor element 2 has a main element 2m and a sense element 2s. The main element 2m and the sense element 2s are formed on the same semiconductor substrate. The main element 2m and the sense element 2s have the similar structure to each other. The main element 2m and the sense element 2s are connected in parallel to each other. In this embodiment, an n-channel MOSFET is used as the semiconductor element 2.

The main element 2m and the sense element 2s are designed such that a ratio of a current Is flowing through the sense element 2s and a current Iout flowing through the main element 2m, that is, a sense ratio (=Iout/Is) is a predetermined current ratio. When the semiconductor element 2 is a MOSFET, the main element 2m may be referred to as a main MOS, and the sense element 2s may be referred to as a sense MOS.

The semiconductor element 2 has a gate terminal 2g common to the main element 2m and the sense element 2s. Gate electrodes of the main element 2m and the sense element 2s are electrically connected to the gate terminal 2g. A drive signal is input from the drive circuit 5 to the gate electrodes via the gate terminal 2g. As a result, the main element 2m and the sense element 2s are driven on at the same timing and off at the same timing. Drain electrodes of the main element 2m and the sense element 2s are connected to the power supply terminal 6a. The power supply terminal 6a is electrically connected to a power supply (not shown). A power supply voltage VCS is applied to the drain electrode via the power supply terminal 6a.

A source electrode of the main element 2m is connected to the output terminal 6b. A load 80 is provided between the output terminal 6b and the ground (GND). When the main element 2m, that is, the semiconductor element 2 is turned on, the current Iout flows to the load 80 via the output terminal 6b. As a result, the load 80 is driven. Therefore, the current Iout may be referred to as a drive current or a load current. A source electrode of the sense element 2s is electrically connected to the output terminal 6b via the current detection resistor 3.

The current detection resistor 3 is inserted between the source electrodes. The current detection resistor 3 is a resistor for detecting the current flowing through the sense element 2s. The current detection resistor 3 is connected in series with the sense element 2s. A series circuit of the sense element 2s and the current detection resistor 3 is connected in parallel to the main element 2m. The current detection resistor 3 is provided between the source electrode of the sense element 2s and the source electrode of the main element 2m.

The detection circuit 4 detects the voltage across the current detection resistor 3. The voltage across the current detection resistor 3 is a value that correlates with the current Is. Therefore, the detection circuit 4 detects the current Is. The detection circuit 4 executes a predetermined process based on the detected current Is. For example, the current Is and the reference value are compared, and the comparison result is output to the drive circuit 5.

A drive command IN is input to the drive circuit 5 via the input terminal 6c. The drive circuit 5 generates a drive signal (drive voltage) based on the drive command IN and outputs the drive signal to the gate terminal 2g. The drive circuit 5 drives the semiconductor element 2 by the drive signal, that is, controls between an on-drive and an off-drive. The drive command IN is supplied from a microcomputer that constitutes an ECU (not shown) together with the load drive device 1. The microcomputer outputs a PWM signal as the drive command IN. ECU is an abbreviation for Electronic Control Unit. PWM is an abbreviation for Pulse Width Modulation.

The drive circuit 5 includes a booster circuit 5a and a gate driver 5b. The booster circuit 5a is a circuit that boosts the power supply voltage VCS, and includes a capacitor (not shown) or the like. For example, a charge pump circuit may be used as the booster circuit 5a. The gate driver 5b is a circuit that generates a drive signal and outputs the drive signal to the semiconductor element 2 (gate terminal 2g). The gate driver 5b outputs an on-drive signal corresponding to the boosted voltage by the booster circuit 5a.

(Detection Circuit)

Next, the detection circuit 4 will be described with reference to FIG. 2.

Figure 2:
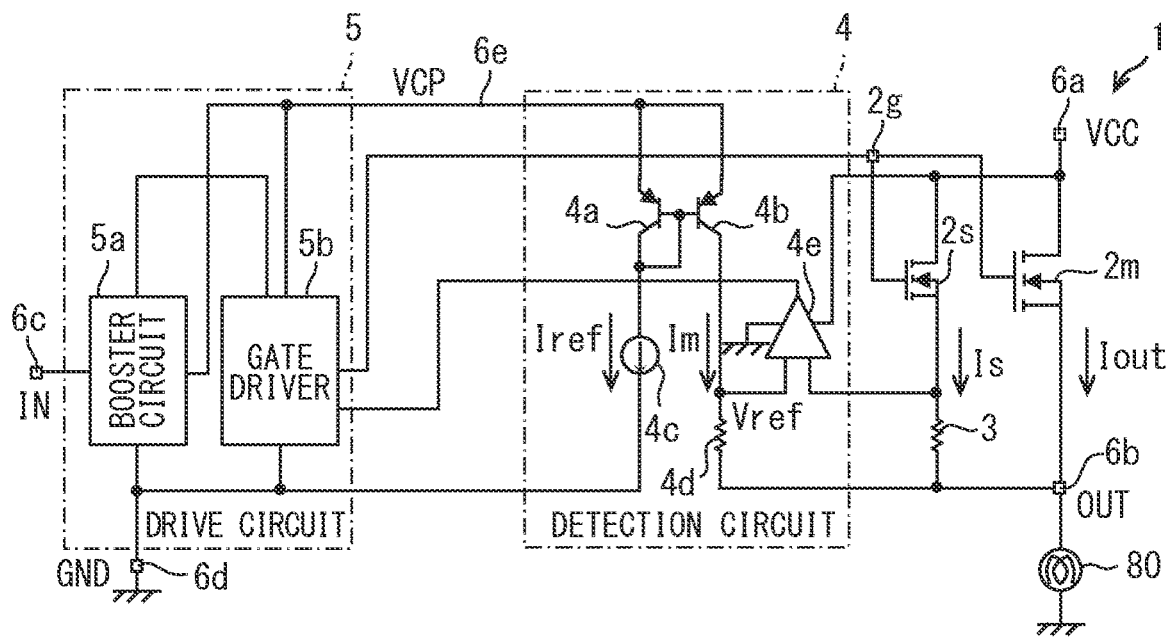
FIG. 2 is a diagram showing a detection circuit.

As shown in FIG. 2, the detection circuit 4 includes switches 4a and 4b constituting a current mirror circuit, a constant current source 4c, a resistor 4d, and a comparator 4e. In the present embodiment, a pnp bipolar transistor is adopted as each of the switches 4a and 4b.

Emitter electrodes of the switches 4a and 4b are connected to the power supply line 6e. In the present embodiment, the power supply line 6e is connected to the booster circuit 5a instead of the power supply for supplying the power supply voltage VCS. As a result, the voltage of the power supply line 6e becomes a boosted voltage VCP. The boost voltage VCP is a voltage higher than the power supply voltage VCS. The boost voltage VCP is, for example, a value higher than a voltage obtained by adding 1 V to the power supply voltage VCS (that is, VCP>VCS+1 V).

Base electrodes of the switches 4a and 4b are electrically connected to each other. The base electrode is connected to the collector electrode of the switch 4a. The constant current source 4c through which a reference current Iref flows is provided between the collector electrode of the switch 4a and the ground terminal 6d (that is, ground). The resistor 4d is provided between the collector electrode of the switch 4b and the output terminal 6b.

With the above configuration, in the current mirror circuit, the mirror current Im flows on the switch 4b side. The mirror current Im corresponds to the reference current Iref flowing on the switch 4a side. As a result, the voltage (reference voltage Vref) at a connection point between the collector electrode of the switch 4b and the resistor 4d becomes stable.

A connection point between the sense element 2s and the current detection resistor 3 is connected to the first input terminal of the comparator 4e. A voltage corresponding to the current Is is input to the first input terminal. A connection point between the collector electrode of the switch 4b and the resistor 4d is connected to the second input terminal of the comparator 4e. A voltage corresponding to the mirror current Im, that is, the above mentioned reference voltage Vref is input to the second input terminal. The comparator 4e compares the reference voltage Vref with the voltage corresponding to the current Is, and outputs the comparison result to the gate driver 5b.

The gate driver 5b generates a drive signal based on the drive command and the comparison result. For example, when it is detected that an overcurrent is flowing through the sense element 2s and eventually the main element 2m, the gate driver 5b outputs the drive signal for forcibly turning off the semiconductor element 2 regardless of the drive command IN.

Although an example in which the boost voltage VCP is applied to the current mirror circuit is shown, the power supply voltage VCS may be applied to the current mirror circuit. In this case, the switch 4a is arranged between the power supply terminal 6a and the ground terminal 6d, and the switch 4b is arranged between the power supply terminal 6a and the output terminal 6b. Therefore, when the semiconductor element 2 is in a full-on state and the voltage Vds between the drain and the source becomes less than 0.5 V, the mirror current Im decreases according to the voltage Vds, as shown by a broken line in FIG. 3. Since a deviation occurs between the mirror current Im and the reference current Iref, an accurate reference voltage Vref cannot be obtained.

Figure 3:
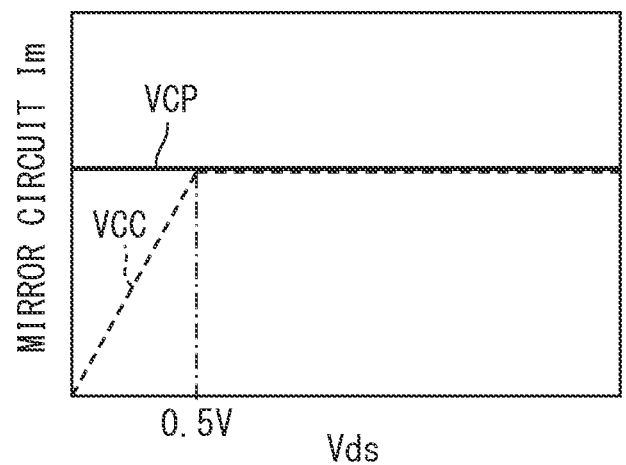
FIG. 3 is a diagram showing a relationship between a voltage Vds and a mirror current Im.

On the other hand, when the boosted voltage VCP described above is used as the power supply for the current mirror circuit, the mirror current Im matches with the reference current Iref up to the voltage Vds=0V, as shown by a solid line in FIG. 3. Therefore, an accurate reference voltage Vref can be obtained up to the voltage Vds=0V.

(Structure of Load Drive Device)

Next, the schematic structure of the load drive device will be described with reference to FIG. 4.

Figure 4:
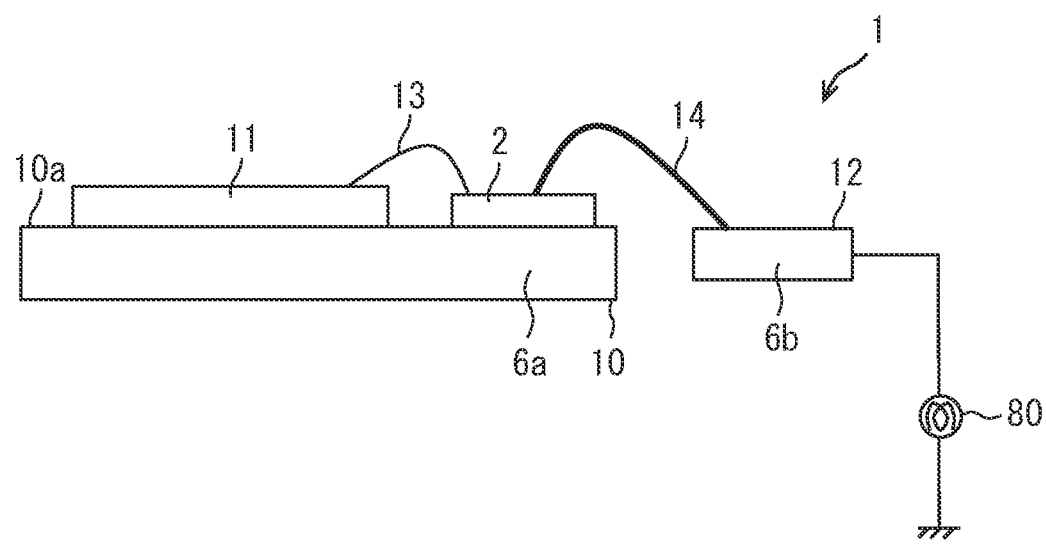
FIG. 4 is a diagram showing a schematic configuration of the load drive device.

As shown in FIG. 4, the load drive device 1 includes a heat sink 10, a semiconductor element 2, an IC chip 11 which is a semiconductor chip different from the semiconductor element 2, a lead 12, and bonding wires 13 and 14.

The heat sink 10 is a metal member made of copper or the like as a constituent material. The heat sink 10 radiates heat from the semiconductor element 2 and the IC chip 11. The semiconductor element 2 and the IC chip 11 are mounted on a front surface 10a of the heat sink 10. The heat sink 10 also serves as a wiring member. The power supply voltage VCS is applied to the heat sink 10. The heat sink 10 corresponds to the power supply terminal 6a.

The current detection resistor 3, the detection circuit 4, and the drive circuit 5 are formed on the IC chip 11. A pad 311 of the semiconductor element 2 is connected to a corresponding circuit of the IC chip 11 via the bonding wire 13. Further, a source electrode 310m of the semiconductor element 2 is connected to the lead 12 via the bonding wire 14. The bonding wire 14 through which the main current flows has a larger diameter than the bonding wire 13. The lead 12 may be referred to as, for example, a bus bar, a wiring member, or an external connection terminal. The lead 12 corresponds to the output terminal 6b. The load 80 is connected to the lead 12.

The above mentioned structure is an example of the load drive device 1. Instead of the bonding wires 13 and 14, a metal plate material or a wiring board may be used. The current detection resistor 3 may be provided on the semiconductor substrate of the semiconductor element 2. In this case, as the current detection resistor 3, for example, polysilicon whose resistance value is adjusted by introducing impurities may be adopted.

Instead of the heat sink 10, the semiconductor element 2 and the IC chip 11 may be mounted on a wiring board. The load 80 may be connected to the semiconductor element 2 without using the lead 12. In this case, the source electrode of the main element 2m corresponds to the output terminal 6b.

(Semiconductor Element)

Next, a schematic configuration of the semiconductor element 2 will be described with reference to FIGS. 5 to 7. In the following description, a thickness direction of a semiconductor substrate 21 is given as a Z direction and one direction orthogonal to the Z direction is given as an X direction. Specifically, the arrangement direction of the pad 311 is given as the X direction. A direction orthogonal to the Z direction and the X direction is referred to as a Y direction. In addition, a shape along an XY plane, in other words, a shape viewed in a plane from the Z direction is simply referred to as a plane shape.

Figure 5:
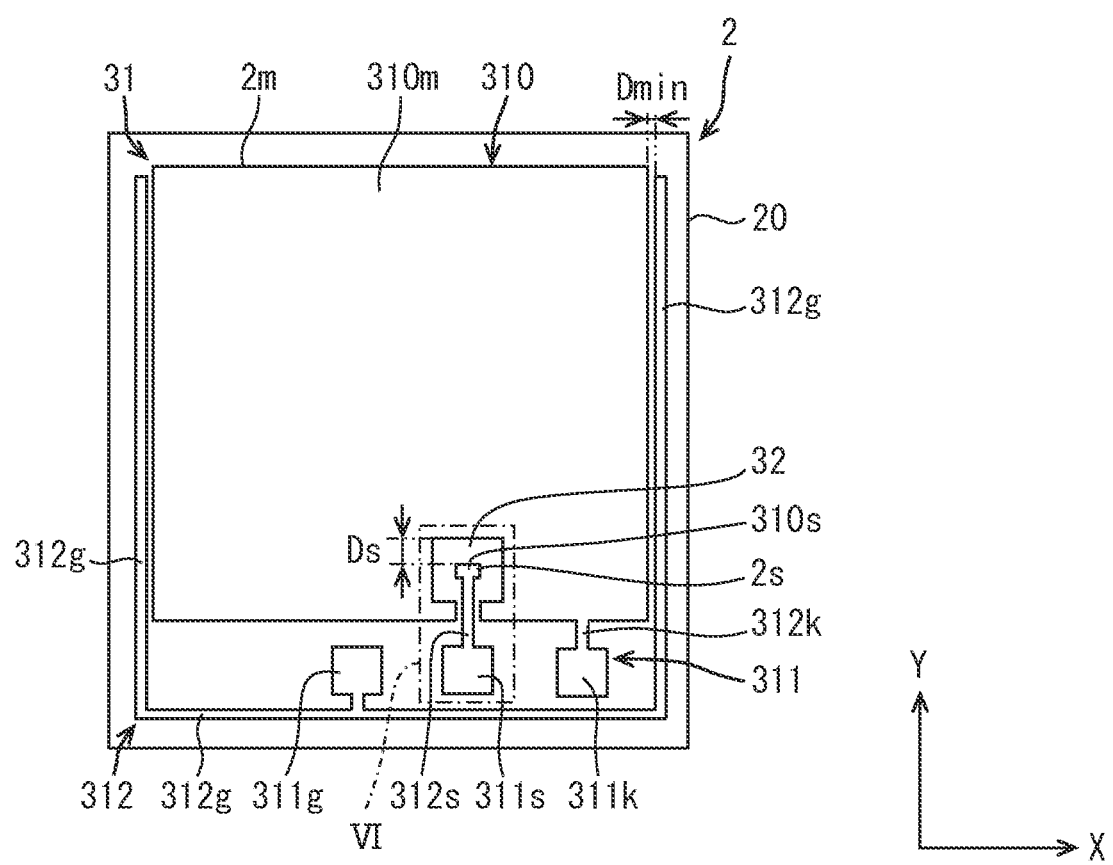
FIG. 5 is a plan view showing a semiconductor element.
Figure 6:
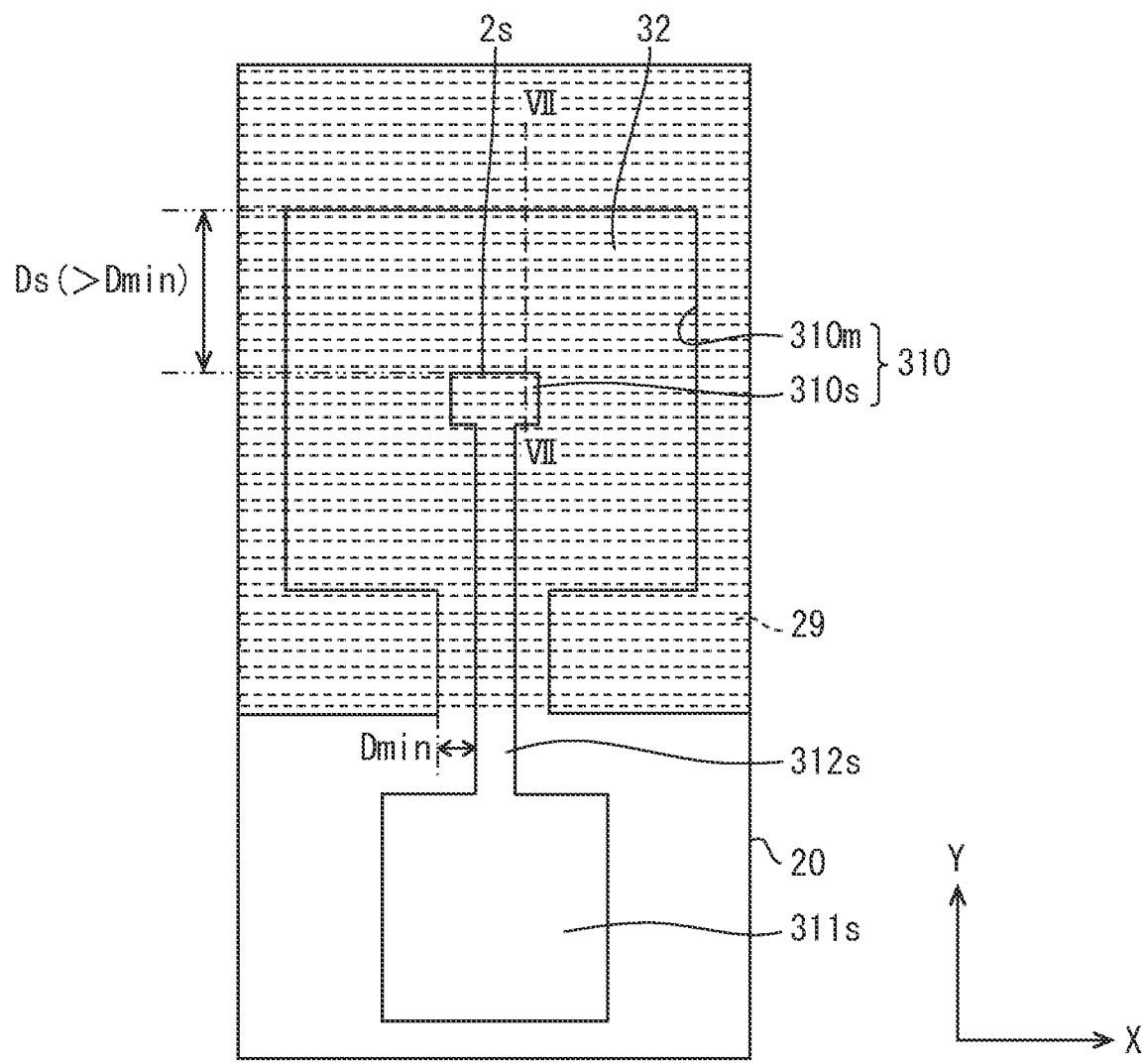
FIG. 6 is an enlarged view of a region VI shown in FIG. 5.
Figure 7:
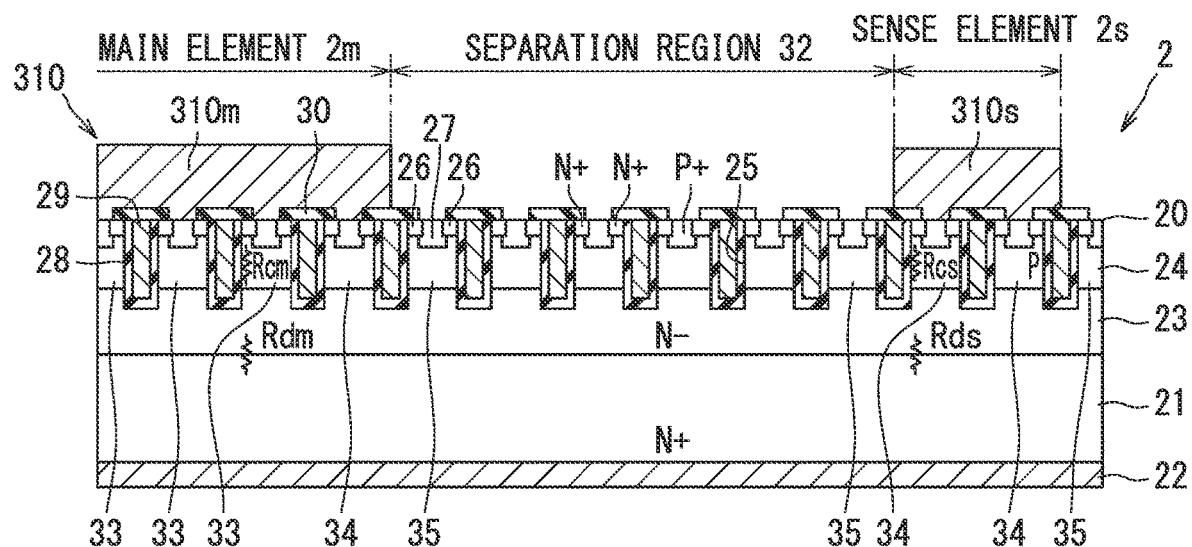
FIG. 7 is a cross-sectional view taken along a line VII-VII in FIG. 6.

As shown in FIGS. 5 to 7, the semiconductor element 2 is configured in a semiconductor chip 20. As shown in FIG. 7, the semiconductor chip 20 includes a semiconductor substrate 21. The semiconductor substrate 21 has a substantially rectangular shape in a plan view. In this embodiment, as the semiconductor substrate 21, an N conductive type (N+) silicon substrate having a high impurity concentration is used. A drain electrode 22 is formed on the front surface of the semiconductor substrate 21. The drain electrode 22 corresponds to a first main electrode on the high potential side. The drain electrode 22 is formed on almost the entire surface of the front surface. The drain electrode 22 is common to the main element 2m and the sense element 2s.

As described above, the drain electrode 22 is formed on front surface side of the semiconductor chip 20. The drain electrode 22 is connected to the heat sink 10 described above. For example, the drain electrode 22 is connected to the heat sink 10 via a joining material such as solder. The power supply voltage VCS is applied to the drain electrode 22 via the heat sink 10 (power supply terminal 6a).

In the semiconductor substrate 21, an N conductive type (N−) epitaxial layer 23 having a lower impurity concentration than the semiconductor substrate 21 is formed on a surface side opposite to the drain electrode 22. The semiconductor substrate 21 and the epitaxial layer 23 form a drain region of the semiconductor element 2 (MOSFET). In the following, the resistance of the semiconductor substrate 21 and the epitaxial layer 23 will be referred to as a drift resistance. The drift resistance may be referred to as a drain resistance.

A P conductive type body region 24 is formed on a surface layer of the epitaxial layer 23. The body region 24 may be referred to as a base region. Further, since a channel is formed in the body region 24, the body region 24 may be referred to as a channel region. A plurality of trenches 25 are formed in the semiconductor chip 20. The trench 25 is formed so as to penetrate the body region 24 and reach the epitaxial layer 23 from the back surface opposite to the front surface of the semiconductor chip 20. In the present embodiment, the trench 25 extends along the X direction while having a predetermined depth in the Z direction. The plurality of trenches 25 are formed at predetermined pitches (equally spaced) in the Y direction. The trench 25 is provided in a striped shape. The body region 24 is divided into a plurality of regions by the trenches 25.

A source region 26 and a body contact region 27 are formed on the surface layer of the body region 24. The source region 26 is an N conductive type (N+) region having a higher impurity concentration than the epitaxial layer 23. The source region 26 extends along the longitudinal direction of the trench 25 so as to contact the side surface of the trench 25 in the region between the trenches 25. The source region 26 has a structure that terminates inside the longitudinal end of the trench 25.

The body contact region 27 is a P conductive type (P+) region having a higher impurity concentration than the body region 24. The body contact region 27, similarly to the source region 26, terminates within the body region 24. The body contact region 27 is sandwiched between two source regions 26 in the arrangement direction of the trench 25. The body contact region 27 extends along the longitudinal direction of the trench 25.

A gate insulating film 28 is formed on the wall surface of the trench 25. A gate electrode 29 is arranged in the trench 25 via the gate insulating film 28. The gate insulating film 28 is embedded in the trench 25 so as to cover the wall surface of the trench 25. The gate electrode 29 is made of polysilicon or the like. The gate electrode 29 is formed on the gate insulating film 28 and is embedded in the trench 25. The semiconductor element 2 has a gate electrode 29 having a trench structure. When an on-drive signal (on-drive voltage) is applied to the gate electrode 29, a channel (inversion layer) connecting the source region 26 and the epitaxial layer 23 is generated in the body region 24. The channel is generated adjacent to the trench 25 (gate insulating film 28).

The gate electrode 29 extends in the X direction and is connected to the gate pattern 312g at both ends thereof. As shown in FIG. 6, the gate electrode 29 is not separated by the main element 2m and the sense element 2s, but is common to each other.

In the body region 24, an interlayer insulating film 30 is formed on the surface opposite to the epitaxial layer 23. An opening is formed in the interlayer insulating film 30, and a part of the source region 26 and the body contact region 27 are exposed from the opening.

A wiring 31 is formed on the interlayer insulating film 30. The wiring 31 is formed on the same surface side of the semiconductor chip 20 by patterning the metal layer. The metal layer is formed by using an aluminum-based material such as Al—Si. Since it is desired to suppress an increase in body size while ensuring electrically separated state, the narrowest portion of the adjacent wirings 31, that is, a minimum interval Dmin between the wirings 31, coincides with the minimum interval in the process. The minimum interval in the process depends on the thickness of the metal layer.

In a case of the first metal layer (so-called first aluminum), for example, the thickness is about 5 µm, so the minimum interval is about 5 µm. In a case of the second metal layer (so-called second aluminum), since it is thinner than the first aluminum, the minimum interval is about 1 µm. In the present embodiment, the metal layer has a one-layer structure, and the wiring 31 is composed of the first metal layer (first aluminum). Therefore, the minimum interval Dmin of the wiring 31 is the minimum interval (about 5 µm) in the process.

The wiring 31 includes a source electrode 310, a pad 311 and a pullout pattern 312. The source electrode 310 corresponds to a second main electrode on the low potential side. The source electrode 310 is separated by the main element 2m and the sense element 2s. The source electrode 310 is separated, and the semiconductor element 2 (MOSFET) is divided into the main element 2m (main MOS) and the sense element 2s (sense MOS). The source electrode 310 has a source electrode 310m on the main element 2m side and a source electrode 310s on the sense element 2s side. The source electrode 310 is not provided between the source electrode 310m and the source electrode 310s. A separation region 32 that separates the source electrodes 310m and 310s is provided.

The source electrode 310m has a shape in which a notch portion opening on one side of the rectangle is provided with respect to a base portion having a substantially rectangular shape in a plane. The notch portion is open on the side of the pad 311 in the Y direction. The notch portion has a wide portion having a substantially rectangular shape in a plane accommodating the sense element 2s, and a narrow portion connected to a portion forming a separation region 32 of the wide portion. The narrow portion is narrower than the wide portion. The width is the length in the X direction. The interval Ds is the minimum interval between the source electrodes 310m and 310s. The distance between the source electrodes 310m and 310s may be set as the interval Ds at least in the arrangement direction of the trenches 25, that is, in the Y direction. In the present embodiment, the interval Ds is set in each of the X direction and the Y direction.

In the wide portion, a portion surrounding the sense element 2s forms the above mentioned separation region 32. In the present embodiment, the width of the narrow portion is set so that the interval between the sense source pattern 312s and the source electrode 310m is the above mentioned minimum interval Dmin. It should be noted that a notch portion having a constant width may be provided without having a narrow portion. The source electrode 310s has a substantially rectangular shape in a plane. Specifically, the source electrode 310s has a rectangular shape in which the longitudinal direction is the extending direction of the trench 25 and the lateral direction is the arranging direction of the trench 25.

The source electrodes 310m and 310s respectively define the main element 2m and the sense element 2s. In a plan view from the Z direction, a portion overlapping the source electrode 310m is a cell of the main element 2m, and a portion overlapping the source electrode 310s is a cell of the sense element 2s. The main element 2m and the sense element 2s are designed so that ratio of the areas of the source electrodes 310m and 310s correspond to the sense ratio. The area is an area of a plane orthogonal to the Z direction.

The source electrode 310m is connected to the source region 26 and the body contact region 27 located directly below the source electrode 310m. The source electrode 310s is connected to the source region 26 and the body contact region 27 located directly below the source electrode 310s. The source electrode 310m is exposed from a protective film (not shown) such as polyimide so that the source electrode 310m can be connected to the lead 12 (output terminal 6b). As described above, the source electrode 310m is connected to the lead 12 (output terminal 6b) via the bonding wire 14. The source electrode 310s is covered with a protective film. In the separation region 32, the source region 26 and the body contact region 27 are not connected to the source electrode 310 and are covered with a protective film.

The pad 311 is exposed from the protective film so that the pad 311 can be electrically connected to the IC chip 11. The pad 311 is an electrode portion to which the bonding wire 13 is connected. The semiconductor element 2 includes at least a gate pad 311g, a Kelvin source pad 311k, and a sense source pad 311s as the pads 311. The plurality of pads 311 are arranged side by side in the X direction. The gate pad 311g corresponds to the above mentioned gate terminal 2g.

The pullout pattern 312 is connected to the corresponding pad 311. The pullout pattern 312 includes a gate pattern 312g, a Kelvin source pattern 312k, and a sense source pattern 312s. The gate pad 311g is connected to the gate electrode 29 via a gate pattern 312g. The Kelvin source pad 311k is connected to the source electrode 310m via the Kelvin source pattern 312k. The sense source pad 311s is connected to the source electrode 310s via the sense source pattern 312s.

The gate pad 311g is connected to the gate driver 5b of the drive circuit 5 via the bonding wire 13. The Kelvin source pad 311k is connected to the detection circuit 4, specifically the current detection resistor 3 and the resistor 4d, via the bonding wire 13. The sense source pad 311s is connected to the detection circuit 4, specifically the current detection resistor 3 and the input terminal of the comparator 4e, via the bonding wire 13. The source electrode 310s is electrically connected to the lead 12 (output terminal 6b) via the sense source pad 311s, the current detection resistor 3, the Kelvin source pad 311k, and the source electrode 310m.

In the present embodiment, the semiconductor element 2 includes a drain pad (not shown) as the pad 311. The semiconductor chip has an outer peripheral pressure resistant region (not shown) that surrounds the main element 2m and the sense element 2s. In the outer peripheral pressure resistant region, for example, a guard ring is formed. The drain pad is provided outside the outer peripheral pressure resistant region. The drain pad provided on the back surface of the semiconductor chip 20 is electrically connected to the drain electrode 22 via the epitaxial layer 23 and the semiconductor substrate 21. The drain pad is connected to the IC chip 11 via the bonding wire 13. As a result, the power supply voltage VCS is supplied to the IC chip 11.

(Gate Voltage Dependence of Sense Ratio)

Figure 8:
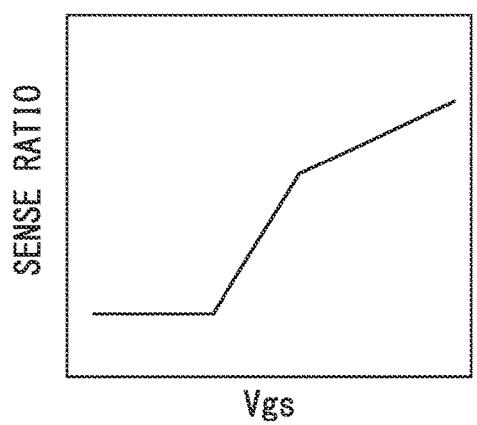
FIG. 8 is a reference diagram showing a gate voltage dependence of a sense ratio.

Based on FIG. 8, the difficulty that the current detection resistor connected in series to the sense element detects the current flowing through the sense element will be described.

The semiconductor element (MOSFET) operates in the saturation region when the gate voltage Vgs is low. Therefore, the on-resistance is large, and the influence of the current detection resistor is very small in the series circuit of the sense element and the current detection resistor. Therefore, the sense ratio is a ratio of the area of the source electrode.

On the other hand, when the gate voltage Vgs becomes high, the semiconductor element operates in a linear region. Therefore, the on-resistance decreases, and the influence of the current detection resistor as the resistance of the series circuit increases. As a result, the current flowing through the sense element becomes relatively small, and as shown in FIG. 8, the sense ratio becomes higher than the area ratio (cell ratio). As described above, the influence of the current detection resistor changes depending on whether the MOSFET is in the saturation region or the linear region, and the sense ratio becomes dependent on the gate voltage.

(Interval Ds and Resistance Value Rs of Current Detection Resistor)

In the present embodiment, the interval Ds between the source electrodes 310m and 310s is wider than the minimum interval Dmin of the wiring 31. That is, the interval Ds is wider than before.

As described above, the facing distance between the source electrodes 310m and 310s is the interval Ds in each X direction and Y direction. Further, the minimum distance Dmin of the wiring 31 is set between the gate pattern 312g and the source electrode 310m. Further, the minimum distance Dmin is also set between the sense source pattern 312s and the source electrode 310m. The minimum interval Dmin of the wiring 31 is the minimum interval (for example, 5 μm) in the process. On the other hand, the interval Ds is, for example, 50 μm.

Figure 9:
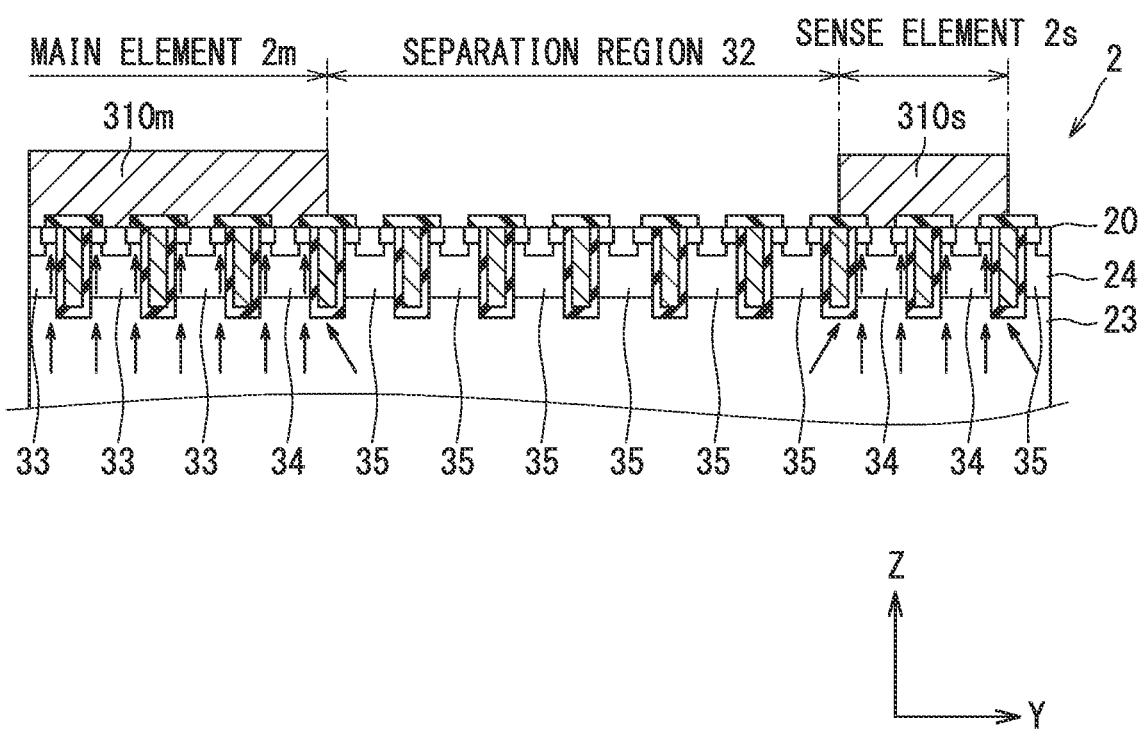
FIG. 9 is a diagram showing a main current flow.

Next, the effect of widening the interval Ds will be described with reference to FIGS. 7 and 9. As shown in FIG. 7, the resistances of the channels (inverted layer) formed in the body region 24 are shown as channel resistance Rcm and Rcs. The resistors of the semiconductor substrate 21 and the epitaxial layer 23 are referred to as drift resistors Rdm and Rds. The m at the end indicates the main element 2m, and the s at the end indicates the sense element 2s. In FIG. 7, channels are not shown for convenience.

The inner peripheral cell 33 occupies a large proportion of the main element 2m. Most of the cells constituting the main element 2m are the inner peripheral cells 33. On the other hand, the sense element 2s has a high proportion of the outer peripheral cell 34. The outer peripheral cell 34 is located adjacent to the dummy cell 35 that is the cell of the separation region 32. In the dummy cell 35, the source region 26 and the body contact region 27 are not connected to the source electrode 310. The inner peripheral cell 33 is a cell arranged inside the outer peripheral cell 34. The inner peripheral cell 33 is a cell in which cells on both sides are connected to the source electrode 310.

The semiconductor substrate 21, the epitaxial layer 23, that is, the drain region is connected by the outer peripheral cell 34 and the dummy cell 35. In the present embodiment, as described above, the interval Ds between the source electrodes 310m and 310s, that is, the interval between the main element 2m and the sense element 2s is wide. Therefore, the current (drain current) flowing between the drain electrode 22 and the source electrodes 310m and 310s spreads toward the dummy cell 35 in the drain region as shown by an arrow in FIG. 9. As a result, regarding the resistance value based on the area of the sense element 2s, that is, regarding the resistance value per unit area, the drift resistance Rds of the sense element 2s is lower than the drift resistance Rdm of the main element 2m. In the present embodiment, since the interval Ds between the source electrodes 310m and 310s is wider than the minimum interval Dmin of the wiring 31, the drift resistance Rds is lower than the drift resistance Rdm.

On the other hand, the body region 24 is divided into the outer peripheral cell 34 and the dummy cell 35 by the trench 25. Therefore, when the current reaches the channel, the influence of the dummy cell 35 side disappears. As a result, the resistance value per unit area is substantially equal between the channel resistance Rcs of the sense element 2s and the channel resistance Rcm of the main element 2m.

Figures 10, 11:
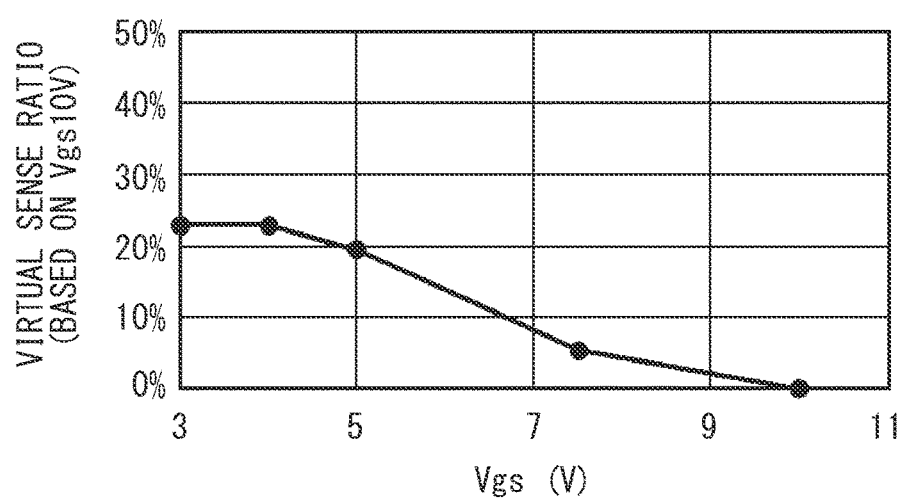
FIG. 10 is a diagram showing a simulation result of a virtual sense ratio.
FIG. 11 is a diagram showing a relationship between a gate voltage and the virtual sense ratio.

Next, the effect of the reduction of the drift resistance Rds on the gate voltage Vgs dependence of the sense ratio will be described. FIGS. 10 and 11 show a simulation result. In this simulation, for the sake of simplicity, the areas of the source electrodes 310m and 310s are set to be equal. The main resistance components of the semiconductor element 2 are the drift resistance and the channel resistance. Therefore, the drift resistance Rdm of the main element 2m is set to 1 as a reference value, and the drift resistance Rds of the sense element 2s is set to a value obtained by multiplying the reference value by a coefficient. Here, the coefficient is set to 0.5. The coefficient of the drift resistance Rds can be changed by the interval Ds. The values of the channel resistors Rcm and Rcs are based on the values of the drift resistance Rdm.

The drift resistors Rdm and Rds do not depend on the gate voltage. On the other hand, the channel resistors Rcm and Rcs depend on the gate voltage. The saturation region is a region in which the channel resistors Rcm and Rcs change rapidly with respect to a change in the gate voltage Vgs. The linear region is a resistance operating region. However, the linear region is a region in which the values of the channel resistances Rcm and Rcs are higher than those in the full-on region. The full-on region is a region in which the values of the channel resistors Rcm and Rcs, which are normally used as the on-drive state, are sufficiently lowered. Since the cell structure is the same, the channel resistances Rcm and Rcs are the same values.

The virtual sense ratio is a virtual sense ratio that takes into consideration the resistance of the semiconductor element 2 and excludes the influence of the current detection resistor 3. In other words, the virtual sense ratio is a sense ratio in a configuration in which the potentials of the source electrodes 310m and 310s are equal to each other. The virtual sense ratio corresponds to a sense ratio B described later. Here, the virtual sense ratio is calculated by the following equation 1 (mathematical formula 1).

Virtual sense ratio=$(Rds+Rcs)/(Rdm+Rcm)$ (Mathematical Formula 1)

The virtual sense ratio (based on Vgs 10V) is a rate of change based on the virtual sense ratio when the gate voltage Vgs is 10V.

As shown in FIG. 10, as the gate voltage Vgs increases, the channel resistors Rcm and Rcs decrease. As a result, the influence of the drift resistors Rdm and Rds on the resistance of the semiconductor element 2 becomes large. When the drift resistors Rdm and Rds are equal to each other, the virtual sense ratio is maintained at 1. However, since the interval Ds is wide and the drift resistors Rdm and Rds are different, the virtual sense ratio decreases as the gate voltage Vgs increases as shown in FIGS. 10 and 11.

By widening the interval Ds and providing a difference between the drift resistors Rdm and Rds per unit area, the virtual sense ratio has a negative gate voltage dependence.

Figures 12, 13:
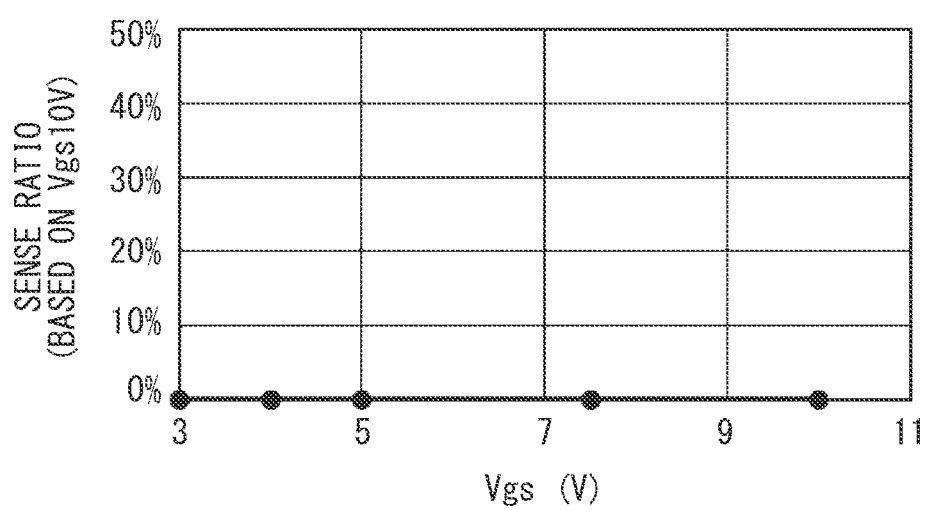
FIG. 12 is a diagram showing a simulation result of a sense ratio.
FIG. 13 is a diagram showing a relationship between a gate voltage and the sense ratio.

FIGS. 12 and 13 show a simulation result. Here, in the same configuration as in FIGS. 10 and 11, the sense ratio including the current detection resistor 3 having the resistance value Rs is simply calculated by the following equation 2. Strictly speaking, the gate voltage Vgs of the sense element 2s deviates by the voltage applied to the current detection resistor 3. However, since the voltage applied to the current detection resistor 3 is small and the influence in the high voltage region where the gate voltage Vgs dependence appears is small, the voltage applied to the current detection resistor 3 is omitted.

Sense ratio=$(Rds+Rcs+Rs)/(Rdm+Rcm)$ (Mathematical Formula 2)

Further, the resistance value Rs is set to a value equal to the difference between the drift resistances Rdm and Rds, that is, 0.5. That is, Rdm=Rds+Rs. Therefore, as shown in FIGS. 12 and 13, even if the channel resistances Rcm and Rcs decrease as the gate voltage Vgs increases, the sense ratio shows a constant value (=1). In this example, the sense ratio does not fluctuate depending on the gate voltage Vgs, and the sense ratio becomes flat.

An example in which the sense ratio is 1 is shown, but the present embodiment is not limited thereto. Assuming that the value of the sense ratio is K, the resistance value Rs of the current detection resistor 3 may be set so as to satisfy Rdm×K=Rds+Rs. For example, when K=100, the resistance value Rs may be set so as to satisfy 100×Rdm=Rds+Rs. As a result, the sense ratio becomes flat.

Summary of First Embodiment

As described above, the semiconductor element 2 is divided into the main element 2m through which the current Iout flows and the sense element 2s for detecting the current through which the current Is flows by separating the source electrode 310 which is the main electrode on the low potential side. The interval Ds between the source electrode 310m of the main element 2m and the source electrode 310s of the sense element 2s is wider than the minimum interval Dmin of the wiring 31. Since the interval Ds is wide, the value of the drift resistance Rds can be reduced by spreading the current flowing through the sense element 2s toward the dummy cell 35. By reducing the drift resistance Rds, the virtual sense ratio can have a negative gate voltage dependence.

Then, the resistance value Rs of the current detection resistor 3 is set so as to satisfy Rdm×K−Rds=Rs. Thereby, the positive gate voltage dependence caused by providing the current detection resistor 3 between the source electrodes 310m and 310s can be completely canceled. As a result, the sense ratio becomes flat regardless of the gate voltage Vgs. Therefore, the current can be detected accurately in a wide voltage range.

An example of setting the resistance value Rs so as to satisfy Rdm×K−Rds=Rs has been shown, but the present disclosure is not limited thereto. The resistance value Rs may be set within a range satisfying the following equation 3 while separating the source electrodes 310 so as to satisfy the interval Ds>the minimum interval Dmin.

$$0 \leq |Rdm \times K - (Rds+Rs)| < Rdm \times K - Rds \quad \text{(Mathematical Formula 3)}$$

By widening the interval Ds, the drift resistance Rds can be reduced and the virtual sense ratio can have a negative gate voltage dependence. Then, by setting the resistance value Rs so that the value of (Rds+Rs) approaches Rdm×K, the sense ratio can be made close to be flat. Therefore, the gate voltage dependence of the sense ratio can be suppressed. For example, as long as it is within the range satisfying the above equation 3, the sense ratio can be intentionally made to have a predetermined positive or negative gate voltage dependence.

The difference (Rdm×K−Rds) becomes large by reducing the drift resistance Rds. Thus, a large value can be set as the resistance value Rs. Therefore, it is possible to suppress the gate voltage dependence of the sense ratio while suppressing an increase in the body size of the current detection resistor 3 and thus the body size of the load drive device 1.

Figure 14:
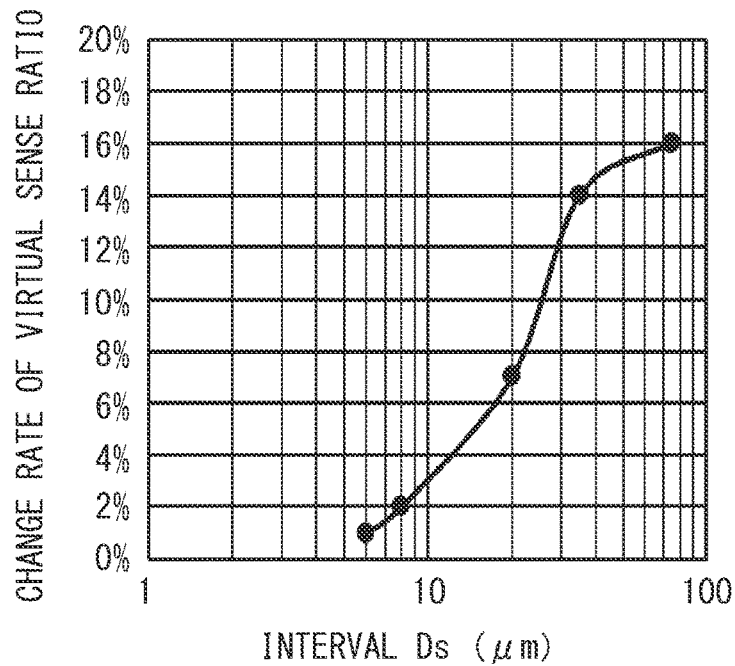
FIG. 14 is a diagram showing a relationship between an interval Ds and the virtual sense ratio.

FIG. 14 is a simulation result showing the relationship between the interval Ds and the virtual sense ratio. In this simulation, the cell pitch was 1 μm and the breakdown voltage BVDS was 40 V. Although not shown, the measured data showed the same tendency. The virtual sense ratio on the vertical axis indicates the virtual sense ratio at the gate voltage Vgs=5V, that is, the rate of change, based on the virtual sense ratio at the gate voltage Vgs=15V.

In FIG. 14, the relationship between the interval Ds and the rate of change is 1% at 6 μm, 2% at 8 μm, 7% at 20 μm, 14% at 35 μm, and 16% at 75 μm. From the result of FIG. 14, it is preferable that the interval Ds is 10 times or more, more preferably 20 times or more (in this case, 20 μm or more) of the cell pitch. As a result, the spread of the current flowing through the sense element 2s can be secured, and the rate of change of the virtual sense ratio can be increased by reducing the drift resistance Rds.

Further, the interval Ds may be 100 times or less, more preferably 50 times or less (in this case, 50 μm or less) of the cell pitch. As a result, it is possible to prohibit the main element 2m and the sense element 2s from being too far apart from each other and causing a deviation in characteristics, that is, a decrease in current detection accuracy. Even when the interval Ds is made wider than the above interval, the rate of change of the virtual sense ratio hardly changes. The rate of change is almost saturated. Therefore, by setting the interval to a predetermined interval or less, the area loss of the semiconductor chip 20 due to the separation region 32 can be suppressed.

Second Embodiment

The second embodiment is a modification of the preceding embodiment as a basic configuration and may incorporate description of the preceding embodiments.

(Circuit Configuration of Load Drive Device)

Figure 15:
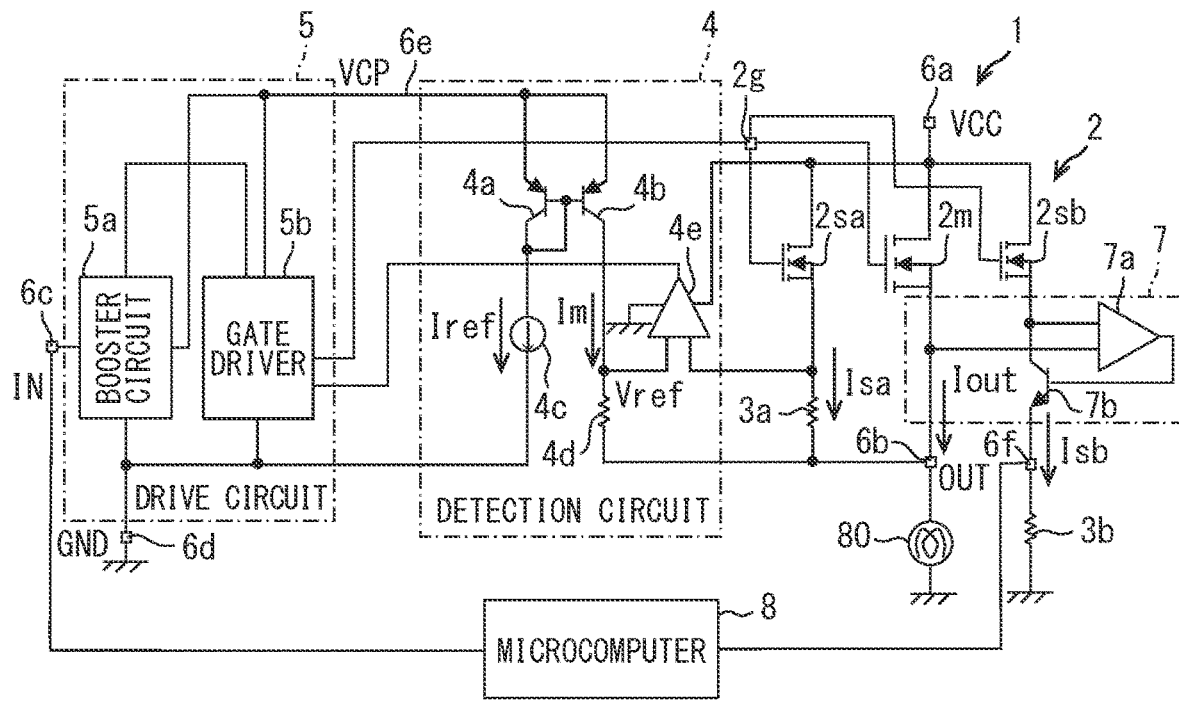
FIG. 15 is a diagram showing a circuit configuration of a load drive device according to a second embodiment.

First, a circuit configuration of a load drive device 1 of the present embodiment will be described with reference to FIG. 15. FIG. 15 corresponds to FIG. 2. A sense element 2sa shown in FIG. 15 corresponds to the sense element 2s of the preceding embodiment, and a current detection resistor 3a corresponds to the current detection resistor 3. A current Isa corresponds to the current Is.

As shown in FIG. 15, the load drive device 1 of the present embodiment further includes a sense element 2sb, a current detection resistor 3b, a current detection terminal 6f, a feedback circuit 7, and a microcomputer 8 with respect to the preceding embodiment.

The semiconductor element 2 has two sense elements 2sa and 2sb. The sense element 2sa corresponds to a first sense element, and the sense element 2sb corresponds to a second sense element. The sense element 2sb is formed on the same semiconductor substrate as the main element 2m and the sense element 2sa, and has the similar structure to the main element 2m and the sense element 2sa. The sense element 2sb is connected in parallel to the main element 2m and the sense element 2sa. The sense element 2sb is designed so that a ratio of the current Isb flowing through the sense element 2sb and the current Iout flowing through the main element 2m, that is, a sense ratio (=Iout/Isb) is a predetermined current ratio. The sense ratio shown in the preceding embodiment, that is, the sense ratio between the sense element 2sa and the main element 2m is shown as a sense ratio A in this embodiment.

The gate electrode of the sense element 2sb is also connected to the gate terminal 2g. Therefore, the sense element 2sb is also driven on and off at the same timing as the main element 2m and the sense element 2s. The drain electrode of the sense element 2sb is also connected to the power supply terminal 6a. The source electrode of the sense element 2sb is connected to the current detection terminal 6f via the switch 7b of the feedback circuit 7. The current detection resistor 3b is provided between the current detection terminal 6f and the ground (GND).

The feedback circuit 7 operates so as to align the potential of the source electrode of the main element 2m with the potential of the source electrode of the sense element 2sb. The feedback circuit 7 has an operational amplifier 7a and a switch 7b. The operational amplifier 7a operates by supplying, for example, a power supply voltage VCS. The source electrode of the sense element 2sb is connected to one of the input terminals of the operational amplifier 7a. The source electrode of the main element 2m is connected to another one of the input terminals. The output terminal of the operational amplifier 7a is connected to the switch 7b.

The switch 7b is provided between the sense element 2sb and the current detection terminal 6f. In this embodiment, an npn type bipolar transistor is used as the switch 7b. The output terminal of the operational amplifier 7a is connected to the base electrode of the switch 7b. The collector electrode of the switch 7b is connected to the source electrode of the sense element 2sb, and the emitter electrode is connected to the current detection terminal 6f. The current detection resistor 3b, the current detection terminal 6f, and the feedback circuit 7 are formed on the IC chip 11.

Since the sense element 2sb uses the feedback circuit 7 including the operational amplifier 7a, the current detection method using the sense element 2sa is superior in responsiveness. The sense element 2sb is used in a small current region to a medium current region, and the sense element 2sa is used in a large current region.

One of the output terminals of the microcomputer 8 is connected to the input terminal 6c. The microcomputer 8 generates a drive command IN based on information acquired from, for example, a higher-level ECU or a sensor (not shown). The microcomputer 8 outputs a PWM signal as the drive command IN. The microcomputer 8 is configured as a semiconductor chip different from the semiconductor element 2 and the IC chip 11.

(Semiconductor Element)

Next, the semiconductor element 2 will be described with reference to FIG. 16. The sense element 2sa shown in FIG. 16 corresponds to the sense element 2s of the preceding embodiment, and the source electrode 310sa corresponds to the source electrode 310s. The sense source pad 311sa corresponds to the sense source pad 311s, and the sense source pattern 312sa corresponds to the sense source pattern 312s. The separation region 32a corresponds to the separation region 32. The interval Dsa corresponds to the interval Ds.

Figure 16:
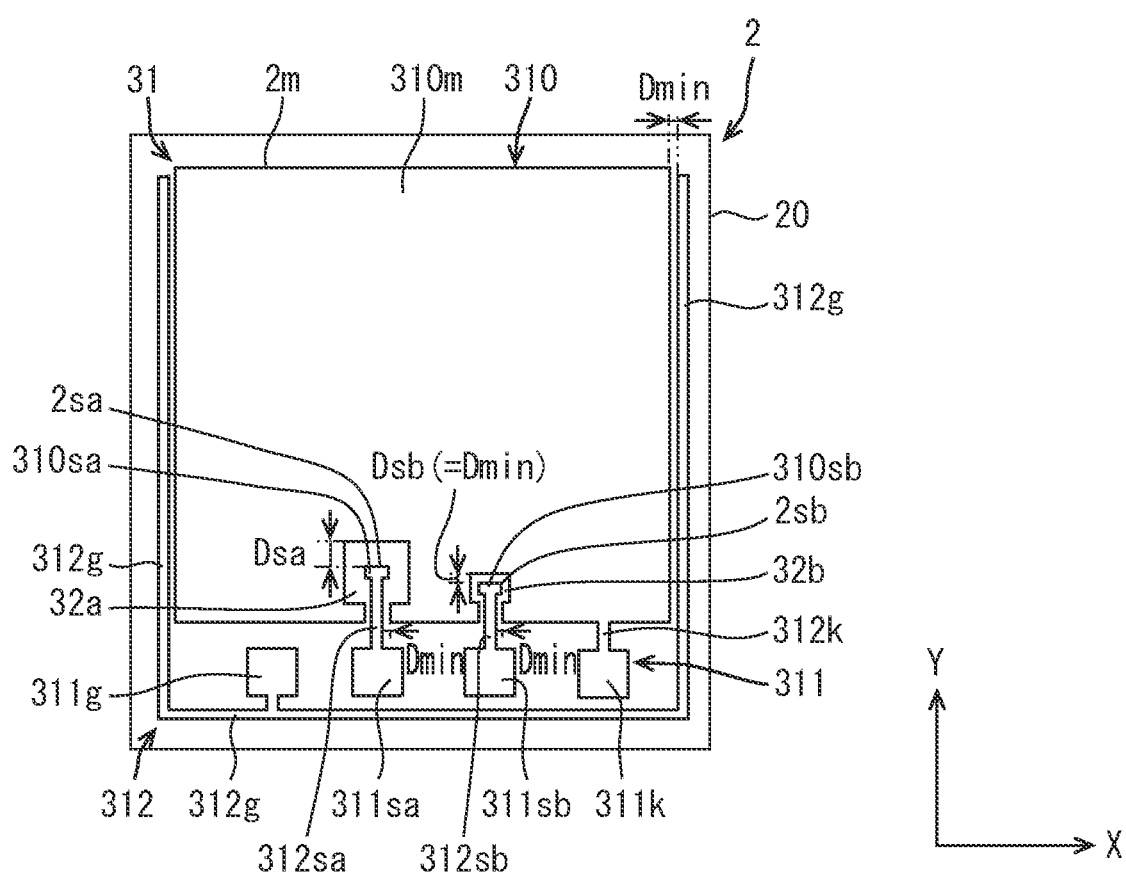
FIG. 16 is a plan view showing a semiconductor element.

As shown in FIG. 16, in the semiconductor element 2 of the present embodiment, the sense element 2sb is added to the preceding embodiment. The basic structure is the same as that of the preceding embodiment. The source electrode 310 is separated by the main element 2m, the sense element 2sa, and the sense element 2sb. The source electrode 310 is separated, and the semiconductor element 2 (MOSFET) is divided into the main element 2m, the sense element 2sa, and the sense element 2sb. The source electrode 310 further includes the source electrode 310sb. The source electrode 310 is not provided between the source electrode 310m and the source electrode 310sb. A separation region 32b that separates the source electrodes 310m and 310s isb is provided.

The source electrodes 310m, 310sa, and 310sb respectively define the main element 2m, the sense element 2sa, and the sense element 2sb. In a plan view from the Z direction, a portion overlapping the source electrode 310sb is the cell of the sense element 2sb. The main element 2m and the sense element 2sb are designed so that ratio of the areas of the source electrodes 310m and 310sb correspond to a sense ratio B. The relationship between the sizes of the source electrodes 310sa and 310sb is not particularly limited. The areas may be different from each other. In this embodiment, the source electrodes 310sa and 310sb have the same shape and the same area. That is, the sense elements 2sa and 2sb have the same shape and the same area. Similar to the preceding embodiment, the sense elements 2sa and 2sb each has a substantially rectangular shape with the X direction as the longitudinal direction.

The source electrode 310m has two notch portions corresponding to the sense elements 2sa and 2sb. The notch portion corresponding to the sense element 2sa is the same as that of the preceding embodiment. This notch portion forms a separation region 32a. The distance between the source electrodes 310m and 310sa is the interval Dsa in each of the X and Y directions. Further, the distance between the sense source pattern 312s and the source electrode 310m is set to the minimum interval Dmin of the wiring 31.

Similarly to the sense element 2sa, the notch portion corresponding to the sense element 2sb also has a wide portion having a substantially rectangular shape in a plane accommodating the sense element 2sb and a narrow portion connected to a portion forming the separation region 32b of the wide portion. The narrow portion is narrower than the wide portion. The interval Dsb is the minimum interval between the source electrodes 310m and 310sb. The distance between the source electrodes 310m and 310sb may be set as the interval Dsb at least in the arrangement direction of the trenches 25, that is, in the Y direction. In the present embodiment, the intervals Dsb are set in each of the X direction and the Y direction. The interval Dsb is narrower than the interval Dsa. Further, the interval Dsb corresponds to the minimum interval Dmin of the wiring 31.

In the wide portion, a portion surrounding the sense element 2sb forms the above mentioned separation region 32b. In the present embodiment, the width of the narrow portion is set so that the distance between the sense source pattern 312sb and the source electrode 310m is the minimum interval Dmin of the wiring 31. It should be noted that a notch portion having a constant width may be provided without having a narrow portion.

The source electrode 310sb is connected to the source region 26 and the body contact region 27 located directly below the source electrode 310sb. The source electrode 310sb is covered with a protective film. In the separation region 32b, the source region 26 and the body contact region 27 are not connected to the source electrode 310 and are covered with the protective film.

The pad 311 further includes a sense source pad 311sb for the sense element 2sb. The gate pad 311g, the sense source pad 311sa, the sense source pad 311sb, and the Kelvin source pad 311k are arranged side by side in the X direction.

The pullout pattern 312 further includes a sense source pattern 312sb. The sense source pad 311sb is connected to the source electrode 310sb via the sense source pattern 312sb. The sense source pad 311sb is electrically connected to the input terminal of the operational amplifier 7a of the feedback circuit 7 and the collector electrode of the switch 7b via the bonding wire 13.

Summary of Second Embodiment

In the configuration including the two sense elements 2sa and 2sb, the interval Dsa is intentionally widened with respect to the interval Dsb instead of aligning the intervals Dsa and Dsb. For example, the interval Dsa is 50 μm and the interval Dsb is 5 μm. Thus, the value of the drift resistance Rds can be reduced by spreading the current flowing through the sense element 2sa toward the dummy cell 35. By reducing the drift resistance Rds, the virtual sense ratio can have a negative gate voltage dependence.

Then, similarly to the preceding embodiment, the resistance value Rs of the current detection resistor 3 is set so as to satisfy $Rdm \times K - Rds = Rs$. Thereby, the positive gate voltage dependence caused by providing the current detection resistor 3a between the source electrodes 310m and 310sa can be completely canceled. As a result, the sense ratio A becomes flat regardless of the gate voltage Vgs. Therefore, the current can be detected accurately in a wide voltage range.

An example of setting the resistance value Rs so as to satisfy Rdm×K−Rds=Rs has been shown, but the present disclosure is not limited thereto. The resistance value Rs may be set within a range satisfying the above equation 3 while separating the source electrodes 310 so as to satisfy the interval Dsa>the minimum interval Dmin.

By widening the interval Dsa, the drift resistance Rds can be reduced and the virtual sense ratio can have a negative gate voltage dependence. Then, by setting the resistance value Rs so that the value of (Rds+Rs) approaches Rdm×K, the sense ratio A can be made close to be flat. Therefore, the gate voltage dependence of the sense ratio A can be suppressed. For example, as long as it is within the range satisfying the above equation 3, the sense ratio A can be intentionally made to have a predetermined positive or negative gate voltage dependence.

The difference (Rdm×K−Rds) becomes large by reducing the drift resistance Rds. Thus, a large value can be set as the resistance value Rs. Therefore, it is possible to suppress the gate voltage dependence of the sense ratio A while suppressing an increase in the body size of the current detection resistor 3$a$ and thus the body size of the load drive device 1.

The preferred interval Ds described in the preceding embodiment may be applied to the interval Dsa described in this embodiment.

By the feedback circuit 7, the potential of the source electrode 310$sb$ of the sense element 2$sb$ is made substantially equal to the potential of the source electrode 310$m$ of the main element 2$m$. Therefore, the sense ratio B exhibits the similar behavior to the virtual sense ratio described in the preceding embodiment. When the interval Dsb is widened, the sense ratio B will have a negative gate voltage dependence. Therefore, it is preferable that the interval Dsb is narrow. In the present embodiment, in the configuration including the two sense elements 2$sa$ and 2$sb$, the interval Dsb is intentionally narrowed with respect to the interval Dsa instead of aligning the intervals Dsa and Dsb. As a result, it is possible to suppress a decrease in detection accuracy on the sense ratio B while suppressing the gate voltage dependence of the sense ratio A. In particular, in the present embodiment, the interval Dsb is set to be the minimum interval Dmin. Therefore, the sense ratio B has almost no gate voltage dependence. This configuration enables more accurate current detection.

In the present embodiment, the sense element 2$sa$ has the similar configuration to the sense element 2$s$ of the preceding embodiment. Therefore, the effect described in the preceding embodiment can be obtained. Specifically, the resistance value Rs of the current detection resistor 3$a$ is set so that the interval Dsa>the minimum interval Dmin is satisfied and the above-mentioned number 3 is satisfied. With this configuration, the gate voltage dependence of the sense ratio can be suppressed. By setting the interval Dsa>the minimum interval Dmin, it is possible to suppress the increase in the body size of the current detection resistor 3 and thus the body size of the load drive device 1 while suppressing the gate voltage dependence of the sense ratio.

Other Embodiments

The disclosure in this specification and drawings etc. is not limited to the above-described embodiments. The disclosure encompasses the above-described embodiments and modifications based on the embodiments by those skilled in the art. For example, the disclosure is not limited to the combinations of parts and/or elements shown in the embodiments. The present disclosure may be implemented in various combinations. The disclosure may have additional parts that may be added to the embodiments. The disclosure covers omissions of parts and/or elements of the embodiments. The disclosure covers replacement or combination of components, elements between one of the embodiments and another. The disclosed technical scope is not limited to the description of the embodiments. The several technical ranges disclosed are indicated by the description of the claims, and should be construed to include all modifications within the meaning and range equivalent to the description of the claims.

The disclosure in the specification, drawings and the like is not limited by the description of the claims. The disclosures in the specification, the drawings, and the like encompass the technical ideas described in the claims, and further extend to a wider variety of technical ideas than those in the claims. Therefore, various technical ideas can be extracted from the disclosure of the specification, the drawings and the like without being limited to the description of the claims.

The detection circuit 4, the drive circuit 5, the feedback circuit 7, and the microcomputer 8 are provided by a control system including at least one computer. The computer includes at least one processor (hardware processor) that is hardware. The hardware processor may be provided by the following (i), (ii), or (iii).

(i) The hardware processor may be a hardware logic circuit. In this case, the computer is provided by a digital circuit including a number of programmed logic units (gate circuits). The digital circuit may comprise a memory for storing programs and/or data. The computer may be provided by an analog circuit. A computer may be provided by a combination of a digital circuit and an analog circuit.

(ii) The hardware processor may be at least one processor core that executes a program stored in at least one memory. In this case, the computer is provided by at least one memory and at least one processor core. The processor core is called, for example, a CPU. The memory is also called a storage medium. The memory is a non-transitory and tangible storage medium, which non-temporarily stores a program and/or data readable by the processor.

(iii) The hardware processor may be a combination of the above (i) and the above (ii). (i) and (ii) are placed on different chips or on a common chip.

That is, the means and/or functions provided by the detection circuit 4, the drive circuit 5, the feedback circuit 7, and the microcomputer 8 can be provided by hardware only, software only, or a combination thereof.

Although the example of MOSFET is shown as the semiconductor element 2, the present disclosure is not limited thereto. The semiconductor element 2 can also be applied to another gate-driven switching element such as an IGBT.

What is claimed is:

1. A load drive device comprising:
   a semiconductor element that includes a first main electrode provided on a front surface side and having a higher potential and a second main electrode provided on a back surface side opposite to the front surface and having a lower potential than the first main electrode, wherein the second main electrode is divided such that the semiconductor element includes a main element that supplies electric power to a load in response to the main element being turned on and a sense element that detects a current; and a current detection resistor connected in series to the sense element and provided between the second main electrode of the sense element and the second main electrode of the main element, wherein the main element and the sense element are formed in a metal layer, an interval in the second main electrode between the main element and the sense element is wider than a thickness of the metal layer, a value of a drift resistance in the main element based on an area of the sense element is defined as Rdm, a value of a drift resistance in the sense element is defined as Rds, and a sense ratio between the sense element and the main element is defined as K, and a resistance value of the current detection resistor defined as Rs satisfies 0≤|Rdm×K−(Rds+Rs)|<Rdm×K−Rds.

2. The load drive device according to claim 1, wherein the resistance value Rs satisfies Rdm×K−Rds=Rs.

3. The load drive device according to claim 1, wherein the second main electrode is divided such that the semiconductor element includes the main element, a first sense element that is the sense element, and a second sense element that detects a current, the load drive device further comprising:
a feedback circuit that includes an operational amplifier and aligns a potential of the second main electrode between the main element and the second sense element, wherein an interval in the second main electrode between the main element and the first sense element is wider than an interval in the second main electrode between the main element and the second sense element.

4. A load drive device comprising:
a semiconductor element that includes a first main electrode provided on a front surface side and having a higher potential and a second main electrode provided on a back surface side opposite to the front surface and having a lower potential than the first main electrode, wherein the second main electrode is divided such that the semiconductor element includes a main element that supplies electric power to a load in response to the main element being turned on, a first sense element that detects a current, and a second sense element that detects a current;

a current detection resistor connected in series to the first sense element and provided between the second main electrode of the first sense element and the second main electrode of the main element; and a feedback circuit that includes an operational amplifier and aligns a potential of the second main electrode between the main element and the second sense element, wherein an interval in the second main electrode between the main element and the first sense element is wider than an interval in the second main electrode between the main element and the second sense element, a value of a drift resistance in the main element based on an area of the first sense element is defined as Rdm, a value of a drift resistance in the first sense element is defined as Rds, and a sense ratio between the first sense element and the main element is defined as K, and a resistance value of the current detection resistor defined as Rs satisfies 0≤|Rdm×K−(Rds+Rs)|<Rdm×K−Rds.

5. The load drive device according to claim 4, wherein the resistance value Rs satisfies Rdm×K−Rds=Rs.

\* \* \* \* \*